United States Patent [19]

Frei

[11] Patent Number: 4,537,511

[45] Date of Patent: Aug. 27, 1985

[54] APPARATUS FOR GENERATING AND RADIATING ULTRASONIC ENERGY

[75] Inventor: Karl Frei, Bronschhofen, Switzerland

[73] Assignee: Telsonic AG Fur Elektronische Entwicklung Und Fabrikation, Bronschhofen, Switzerland

[21] Appl. No.: 594,229

[22] Filed: Mar. 28, 1984

Related U.S. Application Data

[63] Continuation of Ser. No. 361,917, Mar. 15, 1982, abandoned.

[30] Foreign Application Priority Data

Jul. 20, 1980 [DE] Fed. Rep. of Germany ....... 3027533

[51] Int. Cl.³ .......................... B01F 11/02; B08B 3/12; H01L 41/04
[52] U.S. Cl. ........................................ 366/127; 134/1; 134/184; 310/323
[58] Field of Search ............... 366/113, 118, 120, 127; 134/1, 184; 310/323

[56] References Cited

U.S. PATENT DOCUMENTS

| | | | |
|---|---|---|---|
| 3,331,589 | 7/1967 | Hammitt et al. | 366/118 X |
| 3,381,525 | 5/1968 | Kartluke et al. | 310/323 X |
| 3,421,939 | 1/1969 | Jacke | 134/1 |
| 3,511,323 | 5/1970 | Riley, Jr. | 310/323 X |
| 3,542,345 | 11/1970 | Kuris | 366/118 X |
| 3,546,498 | 12/1970 | McMaster et al. | 310/323 |
| 3,628,071 | 12/1971 | Harris et al. | 310/323 X |
| 3,672,823 | 6/1972 | Boucher | 134/1 X |
| 3,680,841 | 8/1972 | Yagi et al. | 366/118 |
| 3,698,408 | 10/1972 | Jacke | 366/127 X |
| 3,945,618 | 3/1976 | Shoh | 366/118 |
| 4,016,436 | 4/1977 | Shoh | 310/322 |

FOREIGN PATENT DOCUMENTS 2442672  8/1980  France .................. 134/1

Primary Examiner—Philip R. Coe
Attorney, Agent, or Firm—Roberts, Spiecens & Cohen

[57] ABSTRACT

A method of producing and radiating ultrasonic energy in fluids, in particular for irradiating cleaning baths, having an ultrasonic generator and a converter or transducer associated therewith, is improved with respect of its mode to operation and efficiency by a resonator being immersed in the fluid and the fluid being irradiated by radial components which are produced in the expansion nodes of longitudinal waves of the resonator. A corresponding apparatus with an ultrasonic generator, in accordance with the invention, has a resonator (1) which is connected to a sound transducer (9) towards the fluid or the bath (7) and which is tuned in its longitudinal axis (M) to an integral multiple of the acoustic operating half-wave length $\lambda/2$, to produce transverse compressions at the expansion nodes thereof. The resonator (1) is preferably in the form of a hollow profile of round cross-section and may possibly also contain further resonators.

9 Claims, 4 Drawing Figures

APPARATUS FOR GENERATING AND RADIATING ULTRASONIC ENERGY

This application is a continuation of application Ser. No. 361,917 filed 3/15/82, and now abandoned.

BACKGROUND OF THE INVENTION

The invention relates to apparatus for generating and radiating ultrasonic energy in fluids, in particular for irradiating cleaning baths, having an ultrasonic generator and a converter or transducer associated therewith.

Ultrasonic cleaning installations usually include at least three components parts, namely a tank for containing the cleaning fluid or the coupling medium, an electrical ultrasonic generator and an electro-acoustic sound transducer. The latter converts the electrical oscillations produced by the generator, at the same frequency. Such transducers are secured individually or in groups to tank bottoms or walls. In the case of larger-size installations, the transducers are also built into water-tight casings which are then in turn lowered into the bath fluid.

A distinction is made nowadays in particular between two types of transducers, namely on the one hand the magnetostrictive transducers and on the other piezoelectric tranducers.

The magnetorestrictive nickel-iron transducer is historically the earlier type. In the interests of achieving a high level of conversion efficiency, all power transducers are operated at or in the vicinity of their mechanical natural resonance. However, this requirement alone establishes the most important parameters of a transducer and the dimensions thereof, if its frequency is known.

The main disadvantage from which all transducers suffer is the very poor degree of acoustic matching to the load, that is to say, to the bath fluid. In order to improve the matching effect, the radiating surface must be as large as possible. However, that requirement is clearly subjected to limits insofar as the maximum lateral dimensions of the transducer are restricted by the working frequency on the one hand and the speed of propagation in the material on the other hand. A typical piezoelectric transducer for a working frequency of 20 kHz is about 100 mm in length with a lateral dimension of about 65 mm. The characteristic acoustic impedance $Z_o$ which primarily determines the matching effect is between 1 and 1.5 kg/m²s for fluids ($Z_o$ water = 1.485 kg/m²s), while that of aluminium and steel, which are the materials most widely used, is 17 and 46 kg/cm²s respectively. Accordingly, there is mismatching of about 1:17 to 1:46. Accordingly, the entire transducer under load has a mechanical oscillation quality of about 17 in the case of aluminium and about 46 in the case of steel. These relatively high levels of oscillation quality under load however mean that only about 2 to 6% of the energy obtainable at the transducer is also actually irradiated. The remainder, from 94 to 98%, circulates as idle power in the transducer and there only causes an undesirable increase in temperature and a poor power factor.

As the transducer is limited mechanically (rupture strength) by the current and electrically by the voltage (dielectric strength), in the interests of making good use of its potential and the investment costs, the transducer must therefore be matched to the best possible extent to the load (cleaning fluid). However, there is still another factor which acts against good matching. The power irradiated per unit of surface area cannot be increased as desired, as cavitation causes partial decoupling which is equivalent to a drop in the $Z_o$ of the fluid. The state of the art at the present time now provides that a number of transducers are mounted on the bottoms of tanks or on the immersion oscillator housing and in this way achieves a larger radiation area, with very high investment costs. It will be appreciated that dividing the sound source into separate individual oscillators which are fed by a generator results in an improvement in acoustic homogeneity. It would be very undesirable if the entire ultrasonic power in a bath of about 2 l upwards had to be irradiated from the single acoustic transducer as that would result in a very high degree of non-homogeneity with respect to ultrasonic intensity. It is clear that problems occur here not only because of the poor acoustic matching of the individual transducer to the medium but also in regard to acoustic homogeneity, cavitation, corrosion, service life, reliability, costs or the like.

SUMMARY OF THE INVENTION

The invention described hereinafter provides a substantial improvement on the present state of the art, in virtually all points; in consideration of the above-described circumstances, it is an object of the invention of improving a method and apparatus of the kind set forth above, and eliminating the deficiencies discovered, and in particular achieving homogenisation.

This problem is solved in that a resonator is immersed in the fluid and the fluid is irradiated by radial components of transverse amplitudes, which components are produced in the expansion nodes of longitudinal waves of the resonator. In this arrangement, it has been found particularly advantageous for the radial components to be produced within a tubular resonator, the components each being irradiated perpendicularly from the wall of the resonator.

The apparatus according to the invention has a resonator which is connected to the transducer or converter towards the fluid or the bath and which is tuned in its longitudinal axis to an integral multiple of the acoustic operating half wave length $\lambda/2$ to produce transverse contractions at the expansion nodes of the working frequency.

In accordance with a further feature of the invention, the resonator is in the form of a round bar. The cross-section thereof may also be polygonal, for example square or rectangular. It is of particular advantage for such a resonator to be in the form of a hollow member which is possibly supplied with a fluid. In this arrangement, irradiation occurs inwardly, which results in very high acoustic intensities, due to the focussing effect.

The invention also provides that the resonator is connected to a transducer, for example a piezoelectric transducer, by way of an interposed transformation member. In an advantageous embodiment, the piezoelectric transducer is replaced by a magnetorestrictive transducer.

In addition, it has been found advantageous for the end of the resonator to be closed by an acoustic transformer.

Such an apparatus can be used to irradiate high levels of ultrasonic energy in fluids, and this achieves the desired technical and economic advantages, namely, in comparison with equivalent immersion oscillators, low manufacturing costs and ease of storage as it is only the resonator which must be manufactured to customer specification, while there is a single type of acoustic transducer. In addition, the arrangement can be very easily and quickly matched to special sizes, without expenditure.

Transportation is also facilitated as the apparatus according to the invention is only of light weight. It has also been found that the service life of the resonator exceeds the service life of an immersion oscillator or an acoustic tank by a multiple and in addition the resonator is superior from the technical and from the economy point of view, both to the acoustic tank and also to the immersion oscillator.

A fact which must be considered as a particular advantage is that only about 5% of the costs required at the present time for (PZT) lead zirconate titanate discs are incurred, and the adhesion of the transducers, which is a problemmatic aspect, is eliminated.

The technical advantages are in particular that a single transducer is required for outputs of up to about 1000 watts as matching is facilitated. Matching to the generator is also no longer a problem as there are no load distribution problems, as occur when using a parallel connection of a plurality of transducers. In addition, it should be noted that there is a lower degree of level dependency because of the broadcast characteristic, and in addition a lower level of specific loading per unit of surface area and thus a reduced level of cavitation corrosion.

A fact which must be considered as a particular advantage of the apparatus according to the invention is that installations can easily be designed with higher operating frequencies than 20 kHz (for example 40 kHz).

Using the apparatus according to the invention, there is no adhesion or welding of acoustic transducers to vessels or housing walls, there are no problems with regard to sealing as there are no critical components hanging in the bath compared to immersion oscillators) which could be damaged by the penetration of fluids.

It has been found to be of particular advantage that the apparatus according to the invention can be installed in any positions and the amount of space required for the resonator is less than that required by an immersion oscillator, while in addition the weight of the resonator is only a fraction of the weight of conventional immersion oscillators.

The construction of the resonator permits easy transformation of the amplitude, without having to reduce the radiation surface area.

When using a tubular resonator, there is a highly intensive cleaning action in the centre of the tube, while irradiation of a throughflow is also possible (cleaning wire).

In accordance with a further feature of the invention, at least two resonators can be fitted one over the other in order to intensify the irradiation effect in the throughflow mode of operation.

It is also in accordance with the invention for the desired amplitude or matching to be altered easily and without problems by a transformation member.

In accordance with a further feature of the method according to the invention, the longitudinal oscillation amplitude is reduced at the end of the resonator. In addition, fluid is prevented from passing into the resonator.

Advantageously, at least one reflector may be associated with the round resonator or resonators, the reflector altering the broadcast characteristic thereof and increasing the radiation in a given direction.

With suitable dimensioning, the resonator according to the invention is subjected to a much lower level of material attrition due to the lower level of specific cavitation loading, so that the life expectation thereof is incomparably high, with approximately the same radiation efficiency, this being in comparison with a battery of individual transducers.

BRIEF DESCRIPTION OF THE DRAWING

Further advantages, features and details of the invention will be apparent from the following description of preferred embodiments and with reference to the drawing in which.

DETAILED DESCRIPTION OF THE PREFERRED EMBODIMENTS

Figure 1:
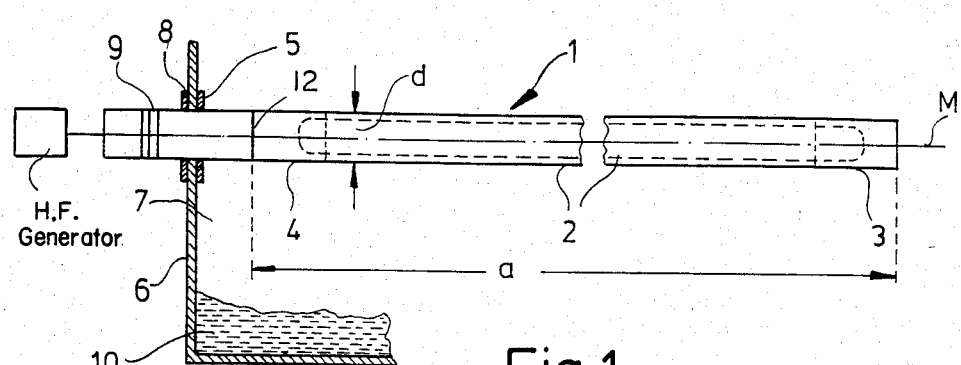
FIG. 1 shows a diagrammatic view in longitudinal section through an apparatus according to the invention.

As shown in FIG. 1, an ultrasonic resonator 1 has a body 2 which is of a bar-like or tubular configuration and which can be of a round or polygonal cross-section. The resonator 1 is tuned in its dimension on the longitudinal axis M to an integral multiple of half an operating wavelength ($\lambda/2$).

The body 2 of the resonator 1 terminates at the right-hand side of the drawing in an acoustic transformer 3 which closes off the hollow body 1 and there reduces the longitudinal amplitude. At the other end, it is connected by means of half an operating wavelength transformation member 4 to the front radial output surface 12 of a piezoelectric transducer 9 which at its amplitude zero point carries a mounting flange 5 which in the illustrated embodiment is mounted to the wall 6, or the bottom, of a cleaning tank indicated at 7.

The piezoelectric transducer passes through the wall 6 or the bottom of the cleaning tank 7 and is fixedly connected to the wall 6 by means of a pressing and sealing flange 8.

The resonator 1 which is produced from a metal or metal alloy is energised in the longitudinal wave mode by the single transducer 9, the natural resonance frequency of which coincides with that of the resonator 1. In addition, the resonator 1 is in direct contact over its entire periphery with the bath fluid 10 in the cleaning tank 7. The dimensions of the resonator 1 are such that in their expansion antinode or loop the longitudinal waves produce expansion waves of the same frequency, which in turn are radiated into the bath fluid 10.

As shearing forces are not transmitted into fluids, the longitudinal wave is not radiated, but instead the radial component produced thereby or the above-mentioned expansion wave. The amplitude of the radial component is phase-shifted through 90° relative to the amplitude of the longitudinal wave and is determined with respect to height by the Poisson's number, the longitudinal amplitude and the geometry of the resonator 1.

Depending on the selected length a and resonance frequency of the resonator 1, up to ten or more half cycles of a standing wave are formed.

Figure 2:
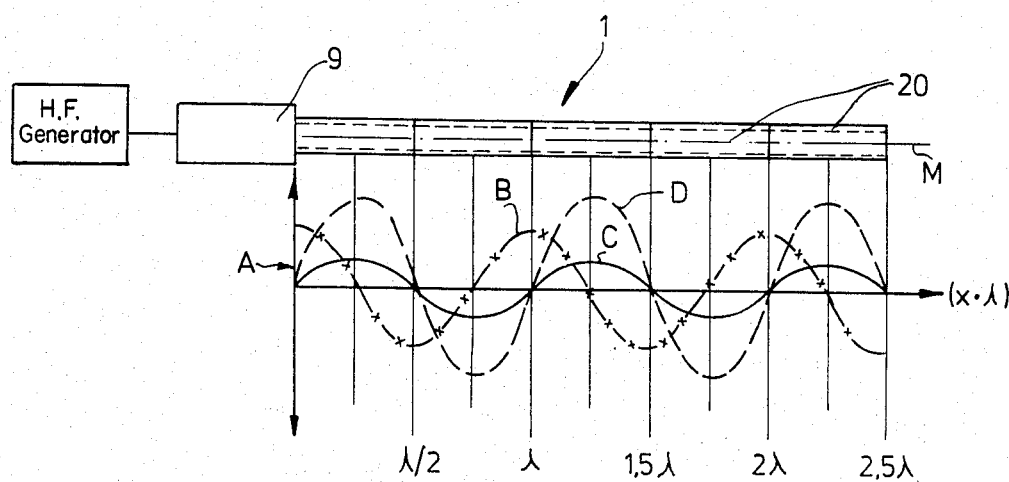
FIG. 2 shows a waveform diagram relating to the amplitude pattern.

FIG 2 shows the amplitude pattern at the resonator 1 which, in a notional model, is divided into individual transducer sections 20. The amplitude is shown on the vertical axis A in FIG. 2. Curve B shows the amplitude pattern with respect to the longitudinal oscillation, curve C shows the amplitude pattern with respect to the radial oscillation component and curve D shows the amplitude pattern with respect to expansion of the longitudinal oscillation.

Around each expansion node is a concentric band of a radially radiating surface. This active surface can be a multiple larger than that of a single acoustic transducer.

If that concentric radiation surface is multiplied by the number of half-waves of the longitudinal oscillation, then it is easy to have an active radiation surface area which is larger than an entire battery of assembled individual acoustic transducers. At the same time however, this arrangement provides very good matching to the bath fluid of a single transducer.

In practice, a tubular member 2 of a few millimeters in wall thickness will advantageously be employed. By suitable selection with respect to the diameter d thereof, it is possible to optimise the radial component of the oscillation by the natural radial resonance frequency coinciding with the longitudinal resonance frequency. However, that is not a condition in regarde to the mode of operation of the arrangement.

As the radiating arrangement is required to have a very high level of resistance to cavitation and good resistance to chemicals, the tubular member 2 is preferably an alloy of Cr, Ni Fe, or titanium. Titanium alloys are expensive and often difficult to obtain; that leaves steel alloys, although these have relatively high internal losses. In order to compensate for those losses, the arrangement does not use a solid bar but the relatively thin-walled tubular member 2. The losses are proportional to the volume of material and for that purpose are greatly dependent on amplitude and frequency.

The entire resonator 1 can be combined with an acoustic transducer 9 in an equivalent circuit diagram which approximately corresponds to the views described hereinafter and shown in FIGS. 3 and 4 respectively, and is applicable in regard to frequencies in the vicinity of the natural resonance frequency.

Figure 3:
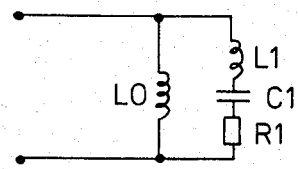
FIG. 3 shows an equivalent circuit for a magnetorestrictive transducer.
Figure 4:
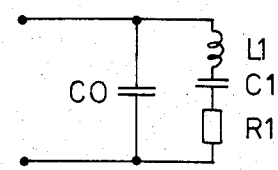
FIG. 4 shows an equivalent circuit for a piezoelectric transducer.

FIG. 3 shows the equivalent circuit diagram for a magnetostrictive acoustic transducer 9 with resonator 1, whereas FIG. 4 shows the equivalent circuit diagram for a piezoelectric acoustic transducer 9 with resonator 1. In these drawings:

$L_1$ = inductance of the equivalent mechanical resonance circuit $C_1$ = capacitance of the equivalent mechanical resonance circuit $R_1$ = sum of the load and loss resistance (also referred to as radiation resistance)

$L_o$ = static transducer parallel inductance and $C_o$ = static transducer parallel capacitance.

Analysis of the two circuit diagrams shows that, with rising load resistance, the idle power falls and the operative power rises, which is equivalent to improved matching of the acoustic transducer to the load.

I claim:

1. A device for the generation and radiation of ultrasonic energy in a liquid comprising: a first resonator having a longitudinal axis and dimensioned to be resonant in a direction along its longitudinal axis, said first resonator having a radial output surface which undergoes longitudinal vibratory displacement as said first resonator is vibrated, and a second resonator comprising a hollow tube including walls in contact with the liquid, means coupling said second resonator to said radial output surface of said first resonator, substantially at an anti-nodal region of axial vibratory motion of said first resonator, for producing longitudinal vibratory motion in said second resonator from said first resonator, said second resonator being dimensioned for producing standing longitudinal waves having a pattern of standing nodes along the second resonator and for converting said longitudinal motion into a standing radial wave motion in said second resonator which is 90° out of phase with the longitudinal wave motion.

2. The device according to claim 1 wherein said second resonator has a round cross-section.

3. The device according to claim 1 wherein said second resonator has a polygonal cross-section.

4. The device according to claim 1 wherein said means coupling the second resonator to the first resonator comprises a transformation member interposed between and connecting said first and second resonators.

5. The device according to claim 1 wherein said second resonator has an end remote from the first resonator and the device further comprises an acoustic transformer closing said remote end of the second resonator.

6. The device according to claim 1 wherein said first resonator has a nodal region with a flange thereat for securing the device to a wall of a vessel containing said liquid.

7. A device according to claim 1 comprising a tank containing a liquid, said second resonator being immersed in said liquid.

8. A device according to claim 1 wherein said second resonator has a length which is equal to a multiple of the wave length of the longitudinal vibratory motion in said second resonator.

9. A device according to claim 8 wherein said hollow tube has thin walls and said transverse vibratory motion in said second resonator is substantially constant along the length of said second resonator.

* * * * *